United States Patent [19]
Barnett et al.

[11] Patent Number: 6,020,735
[45] Date of Patent: Feb. 1, 2000

[54] SWITCHING DEVICE INTERNAL DIODE DETECTION CIRCUIT AND METHOD OF OPERATING THE SAME

[75] Inventors: Rick L. Barnett, Mesquite; Frank H. Chavez, Dallas; Jin He, Plano; Anthony J. Scocca, Garland, all of Tex.

[73] Assignee: Lucent Technologies Inc., Murray Hill, N.J.

[21] Appl. No.: 09/065,957

[22] Filed: Apr. 24, 1998

[51] Int. Cl.[7] .......................... G01R 19/15; G01R 31/327
[52] U.S. Cl. ............................ 324/133; 324/767; 340/644
[58] Field of Search ................................. 324/767, 768, 324/769, 133; 340/641, 644

[56] References Cited

U.S. PATENT DOCUMENTS

| | | | |
|---|---|---|---|
| 3,914,690 | 10/1975 | Shelnutt | 324/767 |
| 4,027,236 | 5/1977 | Stewart | 324/133 |
| 5,428,294 | 6/1995 | Teel, Jr. | 324/418 |

OTHER PUBLICATIONS

S. Clemente, A. Dubhashi and B. Pelly, "IGBT Characteristics," E–3–E–14. (date unavailable).

*Primary Examiner*—Glenn W. Brown

[57] ABSTRACT

An internal diode detection circuit for a device under test (DUT), a method of operating and a test fixture employing the same. In one embodiment, the internal diode detection circuit includes a source of electrical power that applies a reverse bias voltage to the DUT. The internal diode detection circuit also includes a current indicator, series-coupled to the DUT, that generates a signal when a current flows through the DUT. The signal indicates a presence of an internal diode in the DUT.

20 Claims, 2 Drawing Sheets

SWITCHING DEVICE INTERNAL DIODE DETECTION CIRCUIT AND METHOD OF OPERATING THE SAME

TECHNICAL FIELD OF THE INVENTION

The present invention is directed, in general, to power conversion and, more specifically, to an internal diode detection circuit for a device under test (DUT), a method of operating and test fixture employing the same.

BACKGROUND OF THE INVENTION

Switch-mode power converters are widely used in various power conversion applications, such as single-phase and three-phase power factor correction AC/DC rectifiers and DC/AC inverters. As the power levels of the converters are increased, multiple fast switching parallel-connected semiconductor power switches are typically employed to fulfill system application requirements. In some cases, the power switches form main boost switches for a boost converter, which are simultaneously turned on and off.

Two types of conventional power switches are insulated-gate bipolar transistors (IGBTs) and field-effect transistors (FETs). IGBTs exhibit lower conduction losses compared to FETs, but FETs exhibit faster switching capabilities than IGBTs. In many systems having high frequency and power requirements, IGBTs and FETs are both employed in the power supply powering the system. In effect, the IGBTs and FETs are combined to form a "single" switch in the power supply to take advantage of the FETs and IGBTs characteristics. In the process of operating the power supply, generally, the FETs are turned ON, i.e., conducting, first then the IGBTs are turned ON. Therefore, the FETs handle the switching "ON" loss while the IGBTs take care of the conduction loss. Thereafter, the IGBTs are turned OFF, i.e., not conducting, before the FETs are turned OFF. As a result, the IGBTs do not have switching power losses. For example, in a commercially available switch-mode rectifier (208Vin, −52V/220 A output), three IGBTs and three FETs are connected in parallel to form a single boost switch. The FETs are turned ON about tens of nanoseconds before the IGBTs and are turned OFF about a few hundreds of nanoseconds after the IGBTs are turned OFF. Thus, the IGBT experiences low switching power losses (due to the turn-ON and -OFF sequence of the IGBT) and, experiences low conduction losses (due to the nature of the switch, i.e., its lower ON voltage).

The IGBTs and FETs are typically formed in a switch sub-assembly and mounted on a common heat spreader to help dissipate the heat generated by the switches during operation of the power supply. For the switch-mode rectifier introduced above, two such heat spreaders are employed. A problem arises, however, after the switches have been assembled on the heat spreaders. Since both devices are commercially available with the same physical layout and packaging (e.g., an industry standard package TO-247 as provided by International Rectifier Corporation, El Segundo, Calif.) and with mounting clamps positioned over the switches on the heat spreader sub-assembly, it becomes difficult (if not impossible) to visually distinguish between the two kinds of switches. Furthermore, the switches are connected in parallel and are almost nearly switched simultaneously further exacerbating identification problem.

Under normal operating conditions and room temperature, a switch-mode rectifier with multiple parallel-connected switches may successfully pass its function test with switches in the improper location (FETs in place of IGBTs and vice versa). A rectifier with switches in the improper location may even pass its factory burn-in test under certain operating conditions. The failure to detect "swapped" IGBTs and FETs prior to delivery to the customer, though, seriously impacts the reliability of the rectifier. The most significant potential problem with respect to swapped switches is that at elevated operating temperatures, low input line voltage and at maximum rated output power, the unit may fail because the wrong switch (e.g., an IGBT) is absorbing all of the switching losses and/or conduction losses.

Accordingly, what is needed in the art is a system and method of distinguishing between the different types of switches that may otherwise be indistinguishable.

SUMMARY OF THE INVENTION

To address the above-discussed deficiencies of the prior art, the present invention provides, an internal diode detection circuit for a device under test (DUT), a method of operating and a test fixture employing the same. In one embodiment, the internal diode detection circuit includes a source of electrical power that applies a reverse bias voltage to the DUT. The internal diode detection circuit also includes a current indicator, series-coupled to the DUT, that generates a signal when a current flows through the DUT. The signal indicates a presence of an internal diode in the DUT.

The present invention therefore introduces an identification system for a DUT. The present invention recognizes that certain devices, such as field effect transistors (FETs), have an internal antiparallel body diode, while other devices, such as discrete type insulated gate bipolar transistors (IGBTs), may not have an internal body diode depending on the application. With the application of a reverse biased voltage across the terminals of the device, the devices with an internal body diode conduct current that may be detected by a current indicator. The absence or presence of a current flow through the current indicator provides a mechanism of distinguishing between devices that may otherwise be indistinguishable.

In one embodiment of the present invention, the current indicator includes a light emitting diode (LED). Any device capable of detecting current flow and generating a signal to indicate the flow of current is well within the broad scope of the present invention.

In one embodiment of the present invention, the circuit further includes a zener diode, series-coupled to the DUT, that extends an operating range of the source of electrical power. The series-coupled diode not only extends the operating range of the source of electrical power, but also provides a layer of protection to the DUT. In a related, but alternative embodiment, the circuit further includes a transient voltage suppression (TVS) device, such as a zener diode, parallel-coupled to the DUT, that provides transient over-voltage protection to the DUT. Of course, the series-coupled or parallel-coupled zener diodes are not necessary for the broad scope of the present invention.

In one embodiment of the present invention, the circuit further includes a current limiting resistor series-coupled to DUT. Those skilled in the art are familiar with current limiting devices and should appreciate that other current limiting devices are within the broad scope of the present invention.

In one embodiment of the present invention, the circuit further includes a second current indicator series-coupled to a second DUT. The second current indicator generates a signal when a current flows through the second DUT. The signal indicates a presence of an internal diode in the second DUT. The principles of the present invention are equally applicable to a plurality of DUTs.

In one embodiment of the present invention, the DUT is a power switch selected from the group consisting of an insulated gate bipolar transistor (IGBT) and a field effect transistor (FET). The principles of the present invention, however, are not limited to the power switches listed above.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the concepts and the specific embodiments disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
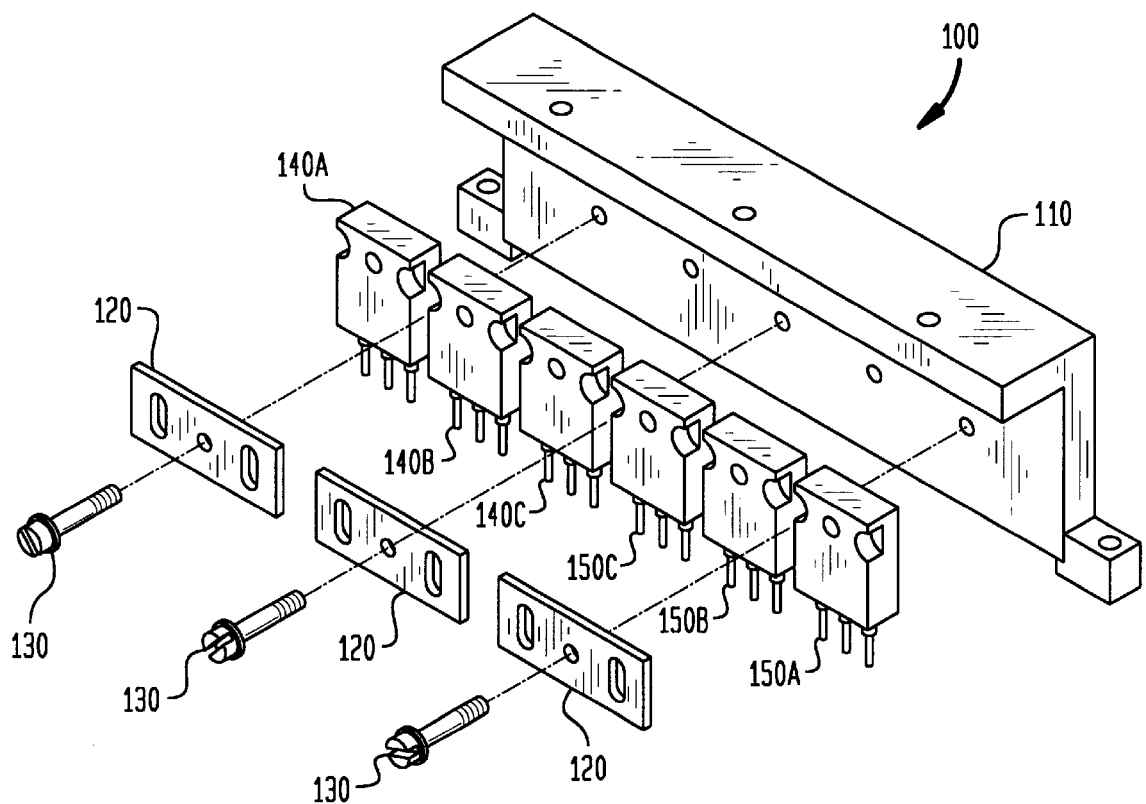
FIG. 1A illustrates an exploded isometric view of a switch sub-assembly.
Figure 1B:
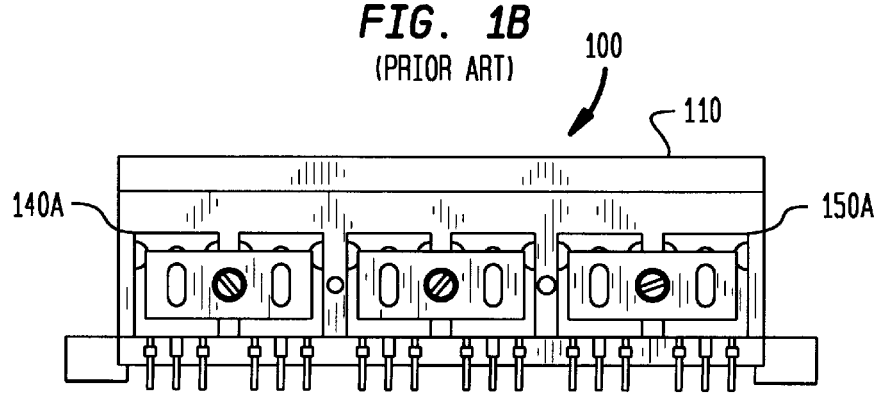
FIG. 1B illustrates a front view of the switch sub-assembly of FIG. 1A mounted on a common heat spreader.

Referring initially to FIGS. 1A and 1B, illustrated are different views of a conventional switch sub-assembly 100 for a converter employing a plurality of parallel-coupled power switches. More specifically, FIGS. 1A and 1B illustrate exploded isometric and front views, respectively, of the switch sub-assembly 100. The switch sub-assembly 100 is mounted on a common heat spreader 110 in FIG. 1B. The switch sub-assembly 100 includes a plurality of power switches that are parallel-coupled to form a single boost switch, for instance. In the illustrated embodiment, first, second and third field effect transistors (FETs) 140A, 140B, 140C and first, second and third insulated gate bipolar transistors (IGBTs) 150A, 150B, 150C form the single boost switch. The plurality of power switches are secured on the common heat spreader 110 with a plurality of mounting clamps and screws, generally designated 120 and 130, respectively.

As previously discussed, with the power switches having the same physical layout and packaging (e.g., the TO-247 package) and with the mounting clamps 120 positioned over the power switches on the common heat spreader 110, it becomes difficult (if not impossible) to visually distinguish between the different types of power switches. Furthermore, the power switches are connected in parallel and are switched almost simultaneously further exacerbating the identification problem.

Again, the converter employing the switch sub-assembly 100 may successfully pass its function test and factory burn-in test even if the switches are in the wrong location. The failure to detect "swapped" switches (e.g., IGBTs and FETs) prior to delivery to the customer, however, seriously impacts the reliability of the converter.

The present invention recognizes that certain switches, such as FETs, have an internal antiparallel body diode, while other switches, such as IGBTs used in boost converters, do not have an internal body diode. With the application of a reverse biased voltage across the power path terminals of the power switch, the devices with an internal body diode will conduct current that may be detected by a current indicator, e.g., a light-emitting diode (LED). The absence or presence of a current flow provides a mechanism for distinguishing between power switches that are otherwise indistinguishable.

Figure 2:
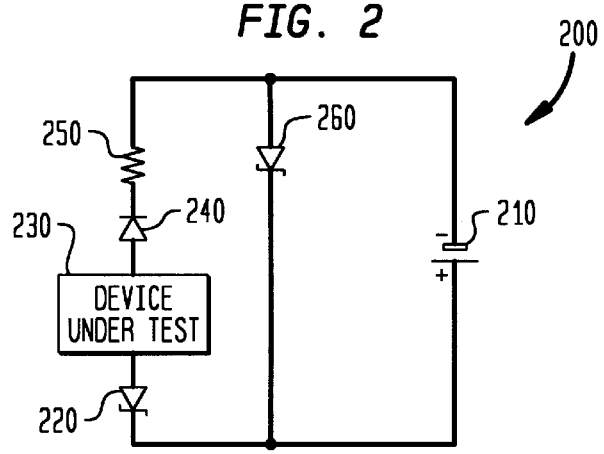
FIG. 2 illustrates a schematic diagram of an embodiment of an internal diode detection circuit according to the principles disclosed by the present invention.

Turning now to FIG. 2, illustrated is a schematic diagram of an embodiment of an internal diode detection circuit 200 according to the principles disclosed by the present invention. The internal diode detection circuit 200 includes a source of electrical power (e.g., a DC voltage source) 210, such as a conventional DC power supply, that provides a reverse biased test voltage to a device under test (DUT, e.g., a power switch) 230. For example, in an advantageous embodiment, the power switch 230 under test may be an FET and the voltage source's 210 positive terminal is coupled to the power switch's 230 source terminal and the voltage source's 210 negative terminal is coupled to the power switch's 230 drain terminal. In another advantageous embodiment, the power switch 230 may be an IGBT, in which case, the voltage source's 210 positive terminal is coupled to the IGBT's emitter terminal and the voltage source's 210 negative terminal is coupled to the IGBT's collector terminal. Any DUT is obviously within the broad scope of the present invention.

The power switch 230 is also series-coupled to a current indicator (e.g., a LED) 240, that illuminates when a current flows through the power switch 230. It should be readily apparent to those skilled in the art that other current indicating devices and methods may also be advantageously employed in the present invention. The present invention is not limited to any particular current indicator or method. A current limiting resistor 250 is also included in the internal diode detection circuit 200 to provide protection for the circuit elements.

The internal diode detection circuit 200 also includes a first zener diode 220 series-coupled to the power switch 230 and the voltage source 210. The first zener diode 220, in a reverse biased configuration with respect to the voltage source 210, not only acts as a substantially constant voltage drop that extends the operating range of the voltage source 210, but also provides protection to the power switch 230. For example, an IGBT's emitter-to-collector breakdown voltage is relatively low, about 20V, and a voltage above the breakdown voltage may damage the device. Alternatively, a voltage above the breakdown voltage may force the device to conduct a substantial leakage current that illuminates the LED 240 and provides a false indication of a presence of an internal diode. Those skilled in the art should readily appreciate that different zener voltage diode combinations may be advantageously employed to permit a larger range of supply voltages. To provide protection to the power switch 230 from transient voltage "spikes," a second zener diode 260 (transient voltage suppression [TVS] device) is coupled in parallel across the voltage source 210 and the power switch 230.

The operation of the internal diode detection circuit 200 will hereinafter be described. With an electrical potential applied (in a reverse bias fashion) across the power path terminals of the power switch 230, i.e., emitter/collector terminals of an IGBT or source/drain terminals of an FET, an antiparallel internal body diode (if present) becomes forward biased and begins to conduct a current. The current, in turn, will illuminate the LED 240 series-coupled to the power switch 230. Conversely, the failure of the LED 240 to illuminate when the electrical potential is placed across the power path terminals of the power switch 230, indicates that an internal antiparallel body diode is not present within the power switch 230.

Figure 3:
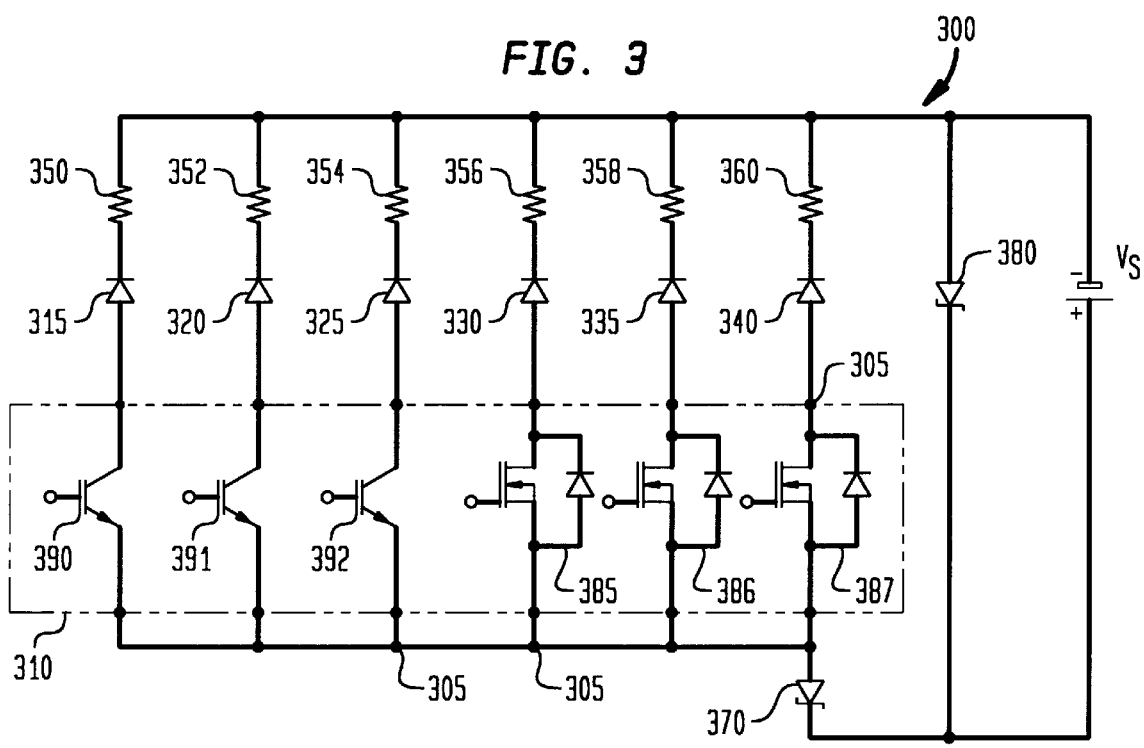
FIG. 3 illustrates a schematic diagram of an embodiment of a power switch test fixture according to the principles of the present invention.

Turning now to FIG. 3, illustrated is a schematic diagram of an embodiment of a power switch test fixture 300 according to the principles of the present invention. As previously discussed, the switch sub-assembly 310 generally includes a plurality of power switches (FETs and IGBTs) that, in combination, form a single switch in a power converter. Since the position of the power switches within the switch sub-assembly 310 is critical for proper operation (see previous discussion above), the power switch test fixture 300 may be used to determine which device, FET or IGBT, is located in a particular location within the switch sub-assembly 310.

The test fixture 300 includes a plurality of switch sockets (aggregately designated 305) adapted to receive a corresponding plurality of power switches. The test fixture 300 also includes a plurality of LEDs designated first, second, third, fourth, fifth and sixth LEDs 315, 320, 325, 330, 335, 340. The test fixture 300 further includes a plurality of current limiting resistors designated first, second, third, fourth, fifth and sixth resistors 350, 352, 354, 356, 358, 360. The test fixture 300 still further includes a first diode 370 and a second diode 380. The function of the current limiting resistors 350, 352, 354, 356, 358, 360 and first and second diodes 370, 380 was previously addressed and will not hereinafter be described.

The test fixture 300 still further includes a voltage source Vs that applies a reverse bias voltage to the plurality of power switches. The voltage source Vs is coupled to the source terminal of the FETs (first, second and third FET 385, 386, 387) or the emitter terminal of the IGBTs (first, second, third IGBTs 390, 391, 392) within the switch sub-assembly 310. Since the first, second and third FETs 385, 386, 387 have an internal antiparallel body diode and the first, second and third IGBTs 390, 391, 392 do not, the fourth, fifth and sixth LEDs 330, 335, 340 coupled to the first, second and third FETs 386, 387, 388, respectively, will indicate a current flow. In an advantageous embodiment, the first, second and third LEDs 315, 320, 325 that are coupled to the first, second and third IGBTs 390, 391, 392, respectively, are red and the fourth, fifth and sixth LEDs 330, 335, 340 that are coupled to the first, second and third FETs 385, 386, 387 are green. Therefore, if an FET is located in a position where an IGBT is required, a red LED is illuminated. Similarly, if a FET is located in a position where a FET is required, a green LED is illuminated.

For a better understanding of power electronics and power converter topologies, see Kassakian, et al., *Principles of Power Electronics,* Addison-Wesley Publishing Company (1991). The aforementioned references are incorporated herein by reference.

Although the present invention and its advantages have been described in detail, those skilled in the art should understand that they can make various changes, substitutions and alterations herein without departing from the spirit and scope of the invention in its broadest form.

What is claimed is:

1. An internal diode detection circuit for a device under test (DUT), comprising:
   a source of electrical power that applies a reverse bias voltage to said DUT; and
   a current indicator, series-coupled to said DUT, that generates a signal when a current flows through said DUT, said signal indicating a presence of an internal diode in said DUT.

2. The circuit as recited in claim 1 wherein said current indicator comprises a light emitting diode (LED).

3. The circuit as recited in claim 1 further comprising a zener diode, series-coupled to said DUT, that extends an operating range of said source of electrical power.

4. The circuit as recited in claim 1 further comprising a zener diode, parallel-coupled to said DUT, that provides transient over-voltage protection to said DUT.

5. The circuit as recited in claim 1 further comprising a current limiting resistor series-coupled to said DUT.

6. The circuit as recited in claim 1 further comprising a second current indicator series-coupled to a second DUT, said second current indicator generating a signal when a current flows through said second DUT, said signal indicating a presence of an internal diode in said second DUT.

7. The circuit as recited in claim 1 wherein said DUT is a power switch.

8. The circuit as recited in claim 7 wherein said power switch is selected from the group consisting of:
   an insulated gate bipolar transistor (IGBT); and
   a field effect transistor (FET).

9. A method for detecting an internal diode in a device under test (DUT), comprising the steps of:
   applying a reverse bias voltage to said DUT;
   sensing a current through said DUT; and
   generating a signal based on a magnitude of said current, said signal indicating a presence of an internal diode in said DUT.

10. The method as recited in claim 9 wherein the steps of sensing and generating are performed by a light emitting diode (LED).

11. The method as recited in claim 9 wherein the step of applying comprises the step of extending an operating range of said reverse bias voltage.

12. The method as recited in claim 9 further comprising the step of providing transient over-voltage protection to said DUT.

13. The method as recited in claim 9 further comprising the step of providing current limit protection to said DUT.

14. The method as recited in claim 9 wherein said DUT is a power switch selected from the group consisting of:
   an insulated gate bipolar transistor (IGBT); and
   a field effect transistor (FET).

15. A test fixture, comprising:
   a plurality of series-coupled switch sockets and light emitting diodes (LEDs), said plurality of switch sockets adapted to receive a corresponding plurality of power switches; and
   a voltage source that applies a reverse bias voltage to said plurality of power switches, said plurality of LEDs configured to generate signals when current flows through said corresponding plurality of power switches, said signals indicating a presence of internal diodes in said corresponding plurality of power switches.

16. The fixture as recited in claim 15 further comprising a zener diode series-coupled to said plurality of switch sockets adapted to extend an operating range of said voltage source.

17. The fixture as recited in claim 15 further comprising a zener diode parallel-coupled to said plurality of switch sockets adapted to provide transient over-voltage protection to said corresponding plurality of power switches.

18. The fixture as recited in claim 15 further comprising a plurality of current limiting resistors coupled to said plurality of series-coupled switch sockets and LEDs.

19. The fixture as recited in claim 15 wherein said plurality of power switches are selected from the group consisting of:

insulated gate bipolar transistors (IGBTs); and field effect transistors (FETs).

20. The fixture as recited in claim 15 wherein said plurality of power switches are formed on a switch sub-assembly.

* * * * *